United States Patent
Yoon et al.

(10) Patent No.: US 7,081,701 B2
(45) Date of Patent: Jul. 25, 2006

(54) CURVED SHAPE ACTUATOR DEVICE COMPOSED OF ELECTRO ACTIVE LAYER AND FIBER COMPOSITE LAYERS

(75) Inventors: Kwang Joon Yoon, Seoul (KR); Hoon Cheol Park, Seoul (KR)

(73) Assignee: The Konkuk University Foundation, Seoul (KR)

( * ) Notice: Subject to any disclaimer, the term of this patent is extended or adjusted under 35 U.S.C. 154(b) by 241 days.

(21) Appl. No.: 10/468,416

(22) PCT Filed: Mar. 14, 2002

(86) PCT No.: PCT/KR02/00444

§ 371 (c)(1),
(2), (4) Date: Aug. 18, 2003

(87) PCT Pub. No.: WO03/047008

PCT Pub. Date: Jun. 5, 2003

(65) Prior Publication Data

US 2004/0070314 A1    Apr. 15, 2004

(30) Foreign Application Priority Data

Nov. 28, 2001    (KR) .............................. 2001-74582

(51) Int. Cl.
*H01L 41/08*    (2006.01)
(52) U.S. Cl. .................. 310/369; 310/371; 310/800
(58) Field of Classification Search ................ 310/369, 310/371, 800
See application file for complete search history.

(56) References Cited

U.S. PATENT DOCUMENTS

| | | | | | |
|---|---|---|---|---|---|
| 4,088,915 | A | * | 5/1978 | Kodama | 310/334 |
| 5,159,228 | A | * | 10/1992 | Schaetzle | 310/338 |
| 5,448,232 | A | * | 9/1995 | Tyburski | 340/933 |
| 5,471,721 | A | | 12/1995 | Haertling | |
| 5,632,841 | A | | 5/1997 | Hellbaum et al. | |
| 5,977,685 | A | * | 11/1999 | Kurita et al. | 310/311 |
| 6,030,480 | A | | 2/2000 | Face, Jr. et al. | |
| 6,936,559 | B1 | * | 8/2005 | Li et al. | 501/136 |

FOREIGN PATENT DOCUMENTS

| | | |
|---|---|---|
| JP | 2288379 | 11/1990 |
| JP | 10225146 | 8/1998 |

* cited by examiner

*Primary Examiner*—Thomas M. Dougherty
(74) *Attorney, Agent, or Firm*—Fay, Sharpe, Fagan, Minnich & McKee, LLP

(57) ABSTRACT

The piezo-composite curved actuator of the present invention includes a piezoelectric layer 10, a lightweight fiber-reinforced lower composite layer 20 with a high GTE (coefficient of thermal expansion) and a low modulus, which is placed under the piezoelectric layer, a lightweight fiber-reinforced upper composite layer 30 with a low GTE and a high modulus, which is placed on the piezoelectric layer, and an insulator layer 23 placed between the piezoelectric layer and the upper composite layer. The piezo-composite curved actuator may further include an insulator layer 24 placed on the upper composite layer. Also, the piezo-composite curved actuator may further include insulator layers 22 placed between the insulator layer 23 and the lower composite layer 20 at the both sides of the piezoelectric layer 10.

11 Claims, 4 Drawing Sheets

CURVED SHAPE ACTUATOR DEVICE COMPOSED OF ELECTRO ACTIVE LAYER AND FIBER COMPOSITE LAYERS

FIELD OF THE INVENTION

The present invention relates to a curved shape actuator device composed of an electro layer and fiber composite layers. More specifically, the present invention relates to a curved shape actuator device composed of an electro layer and fiber composite layers, in which the actuation displacements are improved and the weight is made low by 34% compared with the conventional piezoelectric ceramic actuator, i.e., the thin layer unimorph driver (THUNDER), and in which an electro active ceramic layer is inserted into between glass/epoxy or Kevlar (registered mark)/epoxy layers so as to exclude any electrification of humans, thereby improving the electrical safety.

BACKGROUND OF THE INVENTION

The layered composite material actuator is used for inhibiting the vibrations of airplanes, missiles and space aeronautic structures. Recently, study is widely carried out on the monolithic piezoelectric actuator which generates a high stress as a high performance actuator for controlling the vibrations of the piloting panel of airplanes and marine structures.

However, the monolithic piezoelectric actuator is low in its deformation rate to make it impossible to produce a large displacement, thereby rendering it unsatisfactory as an actuator. Further, the fatigue which cannot be avoided after repeated actuations is one of the problems to be solved. In an attempt to overcome these problems, there are devised and practically used the bimorph piezoelectric actuator (Bimorphs), the reduced and internally biased oxide wafer (RAINBOW), the THUNDER (thin layer unimorph driver) and the like.

The bimorph piezoelectric actuator is that in which the polarizing directions of two piezoelectric ceramics are oppositely arranged so as to produce a deflection based on the tension and compression. This bimorph piezoelectric actuator generates a considerably large displacement, but its actuation power is weak.

The reduced and internally biased oxide wafer (RAINBOW) is that in which one face of the piezoelectric ceramic (PZT) is made contracted through chemical reactions. If graphite is laid together the PZT, and if they are heated to 975° C., then oxygen atoms fly away from the boundary between the PZT and graphite, so that the metallic non-piezoelectric material layer and the piezoelectric material layer are integrated together.

If this structure is cooled, then a curvature is formed owing to the difference between the thermal expansion coefficients of the two layers. In this curved face piezoelectric actuator, a large displacement is produced through a pumping motion, but the ceramic dome structure is vulnerable to impacts.

The THUNDER™ (thin layer unimorph driver) which was developed by the NASA of the United States is a ceramic actuator which produces a large displacement even with a low input voltage, and consists of a metallic material and a piezoelectric thin layer stacked together. A high temperature thermosetting adhesive is spread on stainless steel, and then, a piezoelectric ceramic is laid thereupon. Then aluminum foil is covered thereon, then a curing is carried out at 325° C., and then, cooling is carried out down to the normal temperature, thereby completing its manufacture.

A curvature is formed owing to the differences between the thermal expansion coefficients of the involved elements. Due to this geometrical characteristic, if an electric field is imposed on the ceramic layer, the deformation of the ceramic layer produces a curvature so as to cause a displacement of the central portion. The THUNDER™ shows the most superior performance among the unimorphs which have been developed so far. However, its overall specific gravity is approximately same as that of steel, that is, it is too weighty as a space-aeronautic component.

In this context, the present inventors devised that the metallic layer portions of the THUNDER™ are replaced with a fiber-reinforced polymer layer to lead to a lightweight, and the fiber-reinforced direction and the stacking sequence are optimized. Thus a curved shape actuator device consisting of an electro-active layer and fiber-reinforced composite layers, in which the actuation displacements are improved, has been developed.

OBJECT OF THE INVENTION

It is an object of the present invention to provide a curved shape actuator device which is composed of an electro active material layer and fiber-reinforced polymer composite material layers to improve its weight by 34% or more, and its actuation displacement by 53% or more.

It is another object of the present invention to provide a curved shape actuator device in which an electro active ceramic layer is inserted into between glass/epoxy or Kevlar (registered mark)/epoxy layers to exclude any electrification of humans by the high voltage electric power, thereby rendering the device safer.

It is still another object of the present invention to provide a curved shape actuator device in which the direction and size of the composite material layers are optimized to improve the design flexibility.

It is further object of the present invention to provide a curved shape actuator device in which various sectional shapes of different curvatures can be easily realized along the chord line in accordance with the stacking methods.

The above and other objects of the present invention will be achieved by the present invention as described below.

SUMMARY OF THE INVENTION

The curved shape actuator device composed of composite materials according to the present invention includes: an electro active material layer 10 to be deformed by an electric field; a lightweight fiber-reinforced polymer composite material layer 20 disposed under the electro active material layer 10 and having a high thermal expansion coefficient and a low elasticity coefficient; a lightweight fiber-reinforced polymer composite material layer 30 disposed upon the electro active material layer 10 and having a low thermal expansion coefficient and a high elasticity coefficient; an insulating layer 23 interposed between the electro active material layer 10 and the lightweight fiber-reinforced polymer composite material layer 30; and insulating layers 24 and 22 formed on an outside face of the upper composite material layer 30 and on both sides of the electro active material layer 10 respectively selectively.

DETAILED DESCRIPTION OF THE PREFERRED EMBODIMENT

Figure 1:
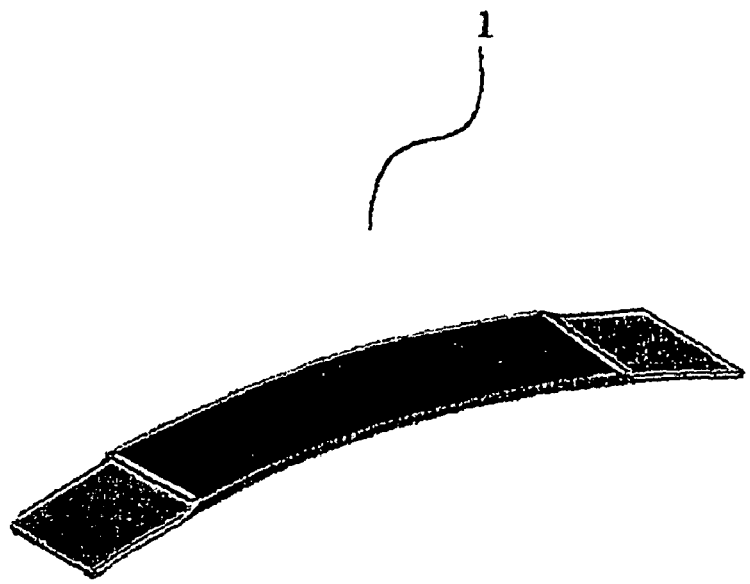
FIG. 1 is a perspective view of the curved shape actuator device composed of composite materials according to the present invention.

The curved shape actuator device composed of composite materials according to the present invention includes: an electro active material layer 10 to be deformed by an electric field; a lightweight fiber-reinforced polymer composite material layer 20 disposed under the electro active material layer 10 and having a high thermal expansion coefficient and a low elasticity coefficient; a lightweight fiber-reinforced polymer composite material layer 30 disposed upon the electro active material layer 10 and having a low thermal expansion coefficient and a high elasticity coefficient; and an insulating layer 23 interposed between the electro active material layer 10 and the lightweight fiber-reinforced polymer composite material layer 30. If the lightweight fiber-reinforced polymer composite material layer 30 is electrically conductive, an insulating layer 24 can be formed on an outside face of the upper composite material layer 30. Further, insulating layers 22 can be additionally formed on both sides of the electro active material layer 10 respectively.

The preferable materials for the electro active material layer 10 include: piezoelectric ceramics, electro active polymers such as PVDF (polyvinylidene fluoride), ferroelectric materials, electro-strictive materials and the like.

In the case where the electro active material layer 10 is made of a piezoelectric ceramic, the lower composite material layer 20 can be made of a glass fiber-reinforced plastic or an engineering plastic, and the upper composite material layer 30 can be made of a carbon fiber-reinforced plastic, or a Kevlar fiber-reinforced plastic.

The insulating layers 22, 23 and 24 can be made of the glass fiber-reinforced plastic or the engineering plastic.

In designing the cross sections of the laminas of the curved actuator composed of the composite materials according to the present invention, the materials and the sizes of the respective layers can be used as the factors for maximizing the performances of the actuator.

Figure 3:
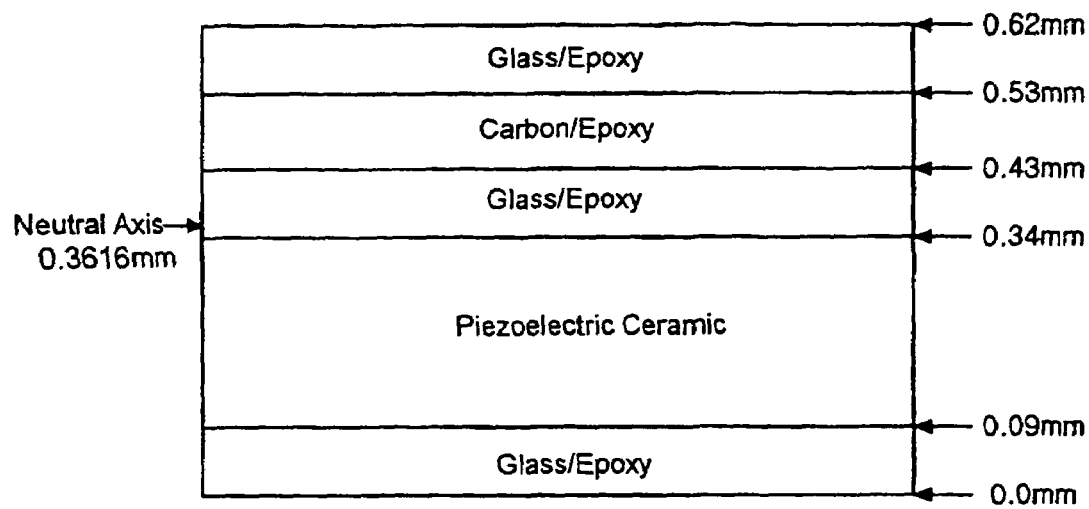
FIG. 3 is a sectional view of a preferred embodiment of the present invention.
Figure 4:
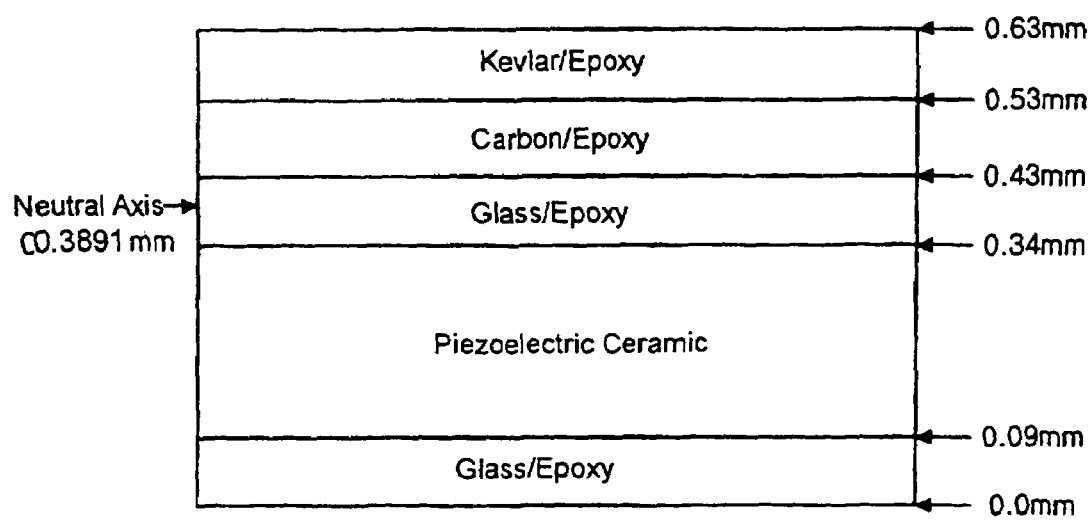
FIG. 4 is a sectional view of another preferred embodiment of the present invention.
Figure 5:
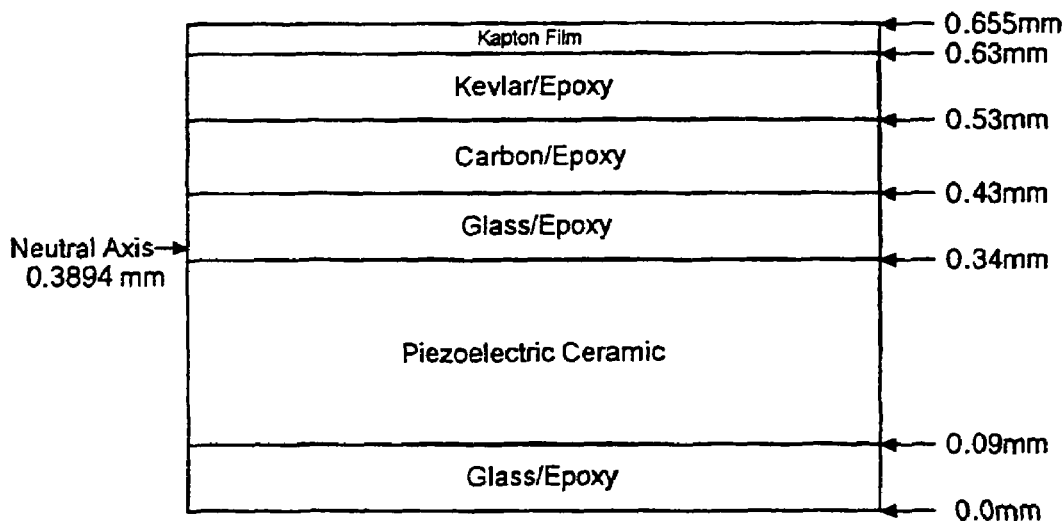
FIG. 5 is a sectional view of still another preferred embodiment of the present invention.
Figure 6:
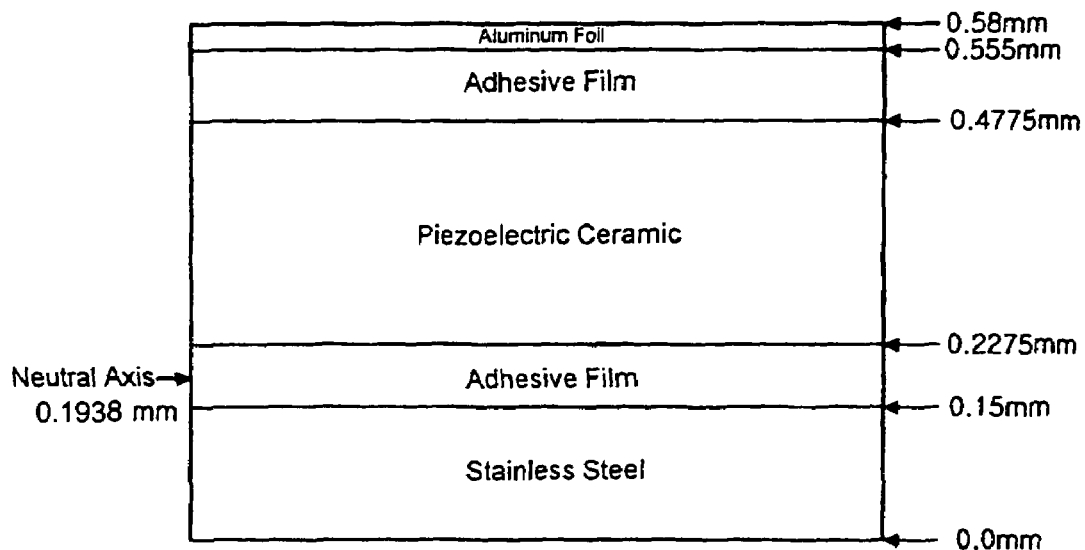
FIG. 6 is a sectional view of the conventional thin layer unimorph drive.

FIGS. 3, 4 and 5 are sectional views of the curved shape actuators (Example 1, 2 and 3) composed of the composite materials according to the present invention. As shown in these drawings, the electro active material layer is disposed so as to depart upward or downward from the deflected neutral surface of the laminas, and the overall bending stiffness is minimized, thereby maximizing the efficiency of the actuator. FIG. 6 is a sectional view of the conventional thin layer unimorph driver (comparative example; THUNDER 7-R, Face International Company).

Generally, the actuation displacements are generated by the bending moment which is internally formed upon supplying a voltage to the electro active material layer. The actuation displacement of the actuator according to the present invention is defined by the following formulas.

Figure 7:
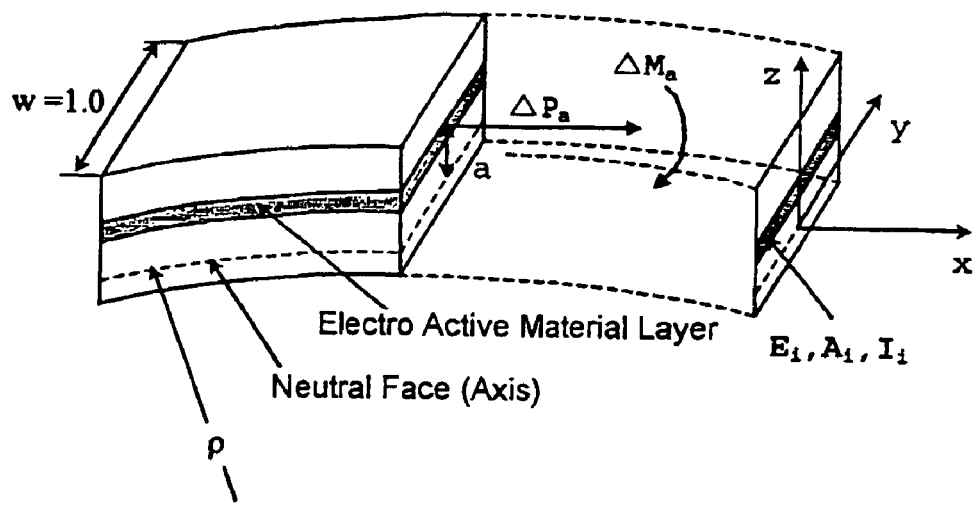
FIG. 7 illustrates the variations of the curvature in the actuator device according to the present invention.

In the case where an internal bending moment is formed in the beam structure of FIG. 7, the curvature variation $\Delta \kappa$ of the actuator can be defined by the following formula:

$$\Delta \kappa = \frac{1}{\Delta \rho} = \frac{\Delta M_a}{D} \qquad (1)$$

where $\rho$ is the curvature formed on the laminas, $M_a$ is the internal bending moment formed in the electro active material layer, and D is the bending stiffness of the respective laminas.

Under this condition, the sum D of the bending stiffness is expressed by the following formula:

$$D = \sum E_i I_i \qquad (2)$$

where $E_i$ is the value of the curvature coefficients of the laminated materials, and $I_i$ is the sectional secondary moment on the central axis.

The bending moment which is internally generated in the actuator is expressed by the actuation arm length multiplied by the actuation power of the electro active material layer. Further, if a voltage is supplied to the electro active material layer, the variation rate $\in_a$ is defined by the following formula:

$$\varepsilon_a = \frac{d_{31}}{t_a} \cdot \Delta V \qquad (3)$$

where $d_{31}$ is the piezoelectric charge coefficient, $t_a$ is the vertical sectional area, and $\Delta V$ is the excitatory voltage supplied to the electro active material layer.

The actuation power $P_a$ is expressed by the vertical sectional area multiplied by the elasticity coefficient and by the deformation rate, and is defined by the following formula:

$$\Delta P_a = t_a \cdot E_a \cdot \in_a = a \cdot E_a \cdot d_{31} \cdot \Delta V \qquad (4)$$

where $t_a$ is the vertical sectional area, $E_a$ is the elasticity coefficient, $\in_a$ is the deformation rate, a is the length of the moment arm, $d_{31}$ is the piezoelectric material constant, and $\Delta V$ is the excitatory voltage supplied to the electro active material layer.

By utilizing the above formulas 1~4, the curvature variation $\Delta \kappa$ of the actuator can be expressed by the following formula:

$$\Delta \kappa = \frac{a}{D} \cdot E_a \cdot d_{31} \cdot \Delta V \qquad (5)$$

where a is the length of the moment arm, D is the bending stiffness of the respective laminas, $E_a$ is the elasticity coefficient, $d_{31}$ is the piezoelectric material constant, and $\Delta V$ is the excitatory voltage supplied to the electro active material layer.

If a/D of the formula 5 is defined with $c_{ua}$, then the curvature variation $\Delta \kappa$ of the actuator can be expressed by the following formula:

$$\Delta \kappa = c_{ua} \cdot E_a \cdot d_{31} \cdot \Delta V \qquad (6)$$

where $c_{ua}$ is the coefficient of unimorph actuator (1/N m), a is the length of the moment arm (m$\times 10^{-4}$), D is the sum of the bending stiffness (N m$^2 \times 10^{-5}$) of the respective laminas, $E_a$ is the elasticity coefficient (GPa), $d_{31}$ is the piezoelectric material constant, and $\Delta V$ is the excitatory voltage (V) supplied to the electro active material layer.

That is, in the actuator device of the present invention, the active layer is made remotely separated from the neutral surface as far as possible, and the overall bending stiffness is minimized, so that the value of $c_{ua}$ is large, thereby maximizing the displacement.

The curved shape actuator composed of the composite materials according to the present invention is manufactured in the following manner. That is, three or more material laminas of different characteristics are stacked upon a planar molding die, and they are cured at an elevated temperature (100–200° C.) by using an autoclave. Then they are detached from the molding die at the normal temperature, and thus, an actuator structure with an asymmetric curvature is obtained. If an exciting voltage is supplied through the upper and lower electrodes 10a and 10b of the electro active material layer 10, then the curvature of the curved surface is varied so that the actuator is deformed.

The curved shape actuator composed of the composite materials according to the present invention can further include insulating layers in addition to the electro active material layer 10, the lower composite material layer 20, the upper composite material layer 30, and the insulating layer 23 interposed between the electro active material layer 10 and the upper composite material layer 30. In the case where the upper composite material layer is electrically conductive, there can be formed a thin insulating layer 24 on the outside face of the upper composite material layer for an electrical insulation. Further, insulating layers 22 can be formed on both ends of the electro active material layer 10 which has a short length compared with the overall length of the actuator, thereby making it possible to adjust the thickness of both ends of the electro active material layer.

In the curved shape actuator composed of the composite materials according to the present invention, the lightweight fiber-reinforced polymer composite material layers 20 and 30 and the insulating layers 22, 23 and 24 are made of highly adhesive high performance fiber-reinforced polymer prepreg composite materials. Accordingly, a separate adhesive layer is not required unlike in the conventional thin layer unimorph driver (THUNDER), and therefore, the manufacturing process is simple.

The curved shape actuator composed of the composite materials according to the present invention can be applied to small airplanes and missiles to control the air flow, and thus can replace the weighty and complicated conventional rotating motors and hydraulic devices, so that the performances of the airplanes and missiles can be improved. Further, it can be applied to valves of mechanical devices, to vibration inhibiting/generating apparatuses, and to noise-removing apparatuses, while it can also be applied to measuring the pressure, force, fluid flow and acoustic waves.

Further, the design flexibility can be enhanced by adjusting the direction and size of the composite material layers, and the sectional shapes of different curvatures can be easily fabricated along the chord line in accordance with the stacking methods.

The examples of the present invention presented below are not intended to limit the scope of the present invention but only for a thorough understanding of the present invention. The scope of the present invention will be limited only by the claims appended below.

EXAMPLE 1

Glass/epoxy, piezoelectric ceramic, glass/epoxy, carbon/epoxy, and glass/epoxy were stacked on a planar molding die in the mentioned sequence, their thickness being as shown in FIG. 3. Then they were cured at the composite material curing temperature (100–200° C.) by using an autoclave, and then, they were detached from the molding die at room temperature, thereby completing the manufacture.

EXAMPLE 2

Glass/epoxy, piezoelectric ceramic, glass/epoxy, carbon/epoxy, and Kevlar/epoxy were stacked on a planar molding die in the mentioned sequence, their thickness being as shown in FIG. 4. Otherwise, the actuator was manufactured like in Example 1.

EXAMPLE 3

Glass/epoxy, piezoelectric ceramic, glass/epoxy, carbon/epoxy, Kevlar/epoxy, and Kapton/epoxy were stacked on a planar molding die in the mentioned sequence, their thickness being as shown in FIG. 5. Otherwise, the actuator was manufactured like in Example 1.

COMPARATIVE EXAMPLE

THUNDER 7-R of Face International of the United States was adopted.

The material properties of Examples 1–3 are shown in Table 1 below.

TABLE 1

| | Property | Piezo ceramic | Carbon epoxy | Kevlar epoxy | Glass epoxy | Polyimide epoxy |
|---|---|---|---|---|---|---|
| Elasticity | $E_1$ (GPa) | 67 | 231.2 | 81 | 21.7 | 2.5 |
| | $E_2$ (GPa) | 67 | 7.2 | 5.1 | 21.7 | 2.5 |
| | $G_{12}$ (GPa) | 25.57 | 4.3 | 1.82 | 3.99 | 0.93 |
| | $V_{12}$ | 0.31 | 0.29 | 0.31 | 0.13 | 0.34 |

TABLE 1-continued

| Property | | Piezo ceramic | Carbon epoxy | Kevlar epoxy | Glass epoxy | Polyimide epoxy |
|---|---|---|---|---|---|---|
| Thermal exp co (CTE) | $\alpha_1(\times 10^6 \deg K)$ | 3 | −1.58 | −3.8 | 14.2 | 20 |
| | $\alpha_2(\times 10^6 \deg K)$ | 3 | 32.2 | 75 | 14.2 | 20 |
| Piezoelectric defmtn coefficient $(d_{31}(\times 10^{-12} m/V))$ | | −190 | — | — | — | — |
| Density (g/cm$^3$) | | 7.8 | 1.51 | 1.44 | 1.91 | 1.42 |
| Commodity & mfg co | | 3195HD (PZT-5H) (US, CTS) | USN125BX Korea SK chemical | KU075NS Korea Hankook Fiber | GF-1114 Korea Hankook Fiber | Kapton type HN Dupont |

In order to compare the performances of the respective actuators, the product THUNDER 7-R of Face International of the United States in which the piezoelectric ceramics (3195HD, CTS Co., USA) were used was formed into a width of 23 mm, and was used in Comparative Example. That is, its shape was similar to the actuator of the present invention.

The weights of the test pieces of Examples 1–3 and the Comparative Example were measured, and tests were carried out as to the displacements with respect to the electric stimulations. The test results are shown in Table 2 and FIG. 7.

TABLE 2

| | Measurement | | Prediction | |
|---|---|---|---|---|
| | thickness (mm) | weight (g) | $Y(m \times 10^{-4})$ | $D(N.m^2 \times 10^{-5})$ |
| Example 1 | 0.62 | 4.8 | 3.616 | 2.48 [$^5$] |
| Example 2 | 0.63 | 4.8 | 3.891 | 3.12 |
| Example 3 | 0.655 | 5.0 | 3.894 | 3.13 |
| Comparative Exp 1 | 0.58 | 7.3 | 1.938 | 2.96 |

Figure 2:
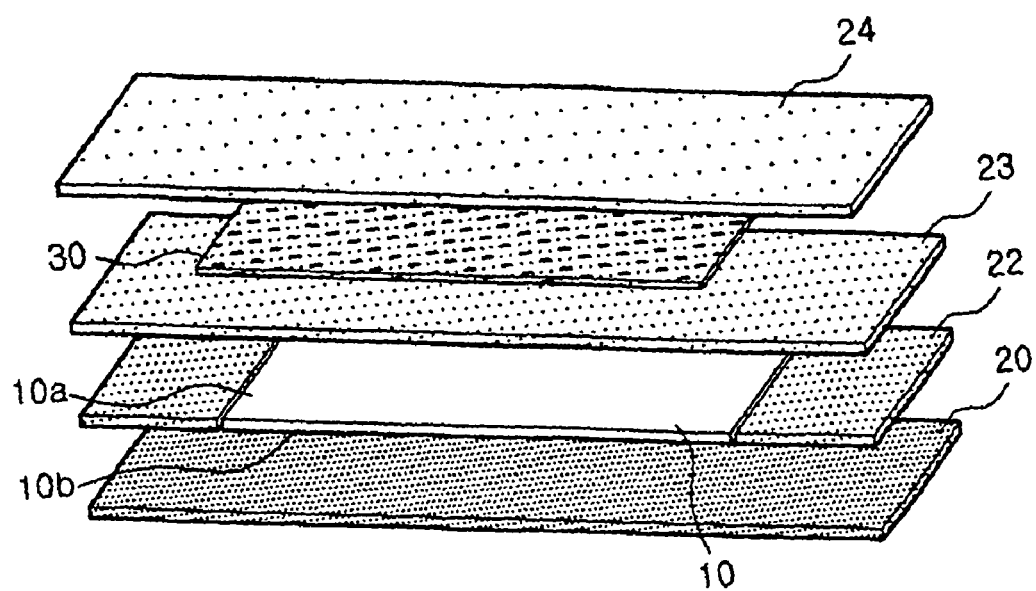
FIG. 2 is a perspective view of the curved shape actuator device composed of composite materials illustrated in FIG. 1, showing its autoclave-formed stacking structure.

As shown in FIG. 2, in the case where the same piezoelectric ceramic materials are used, it was seen that the actuator of the present invention with the lightweight fiber-reinforced polymer materials used therein showed a weight reduction of 34% or more compared with the comparative Example with the aluminum thin layer.

Figure 8:
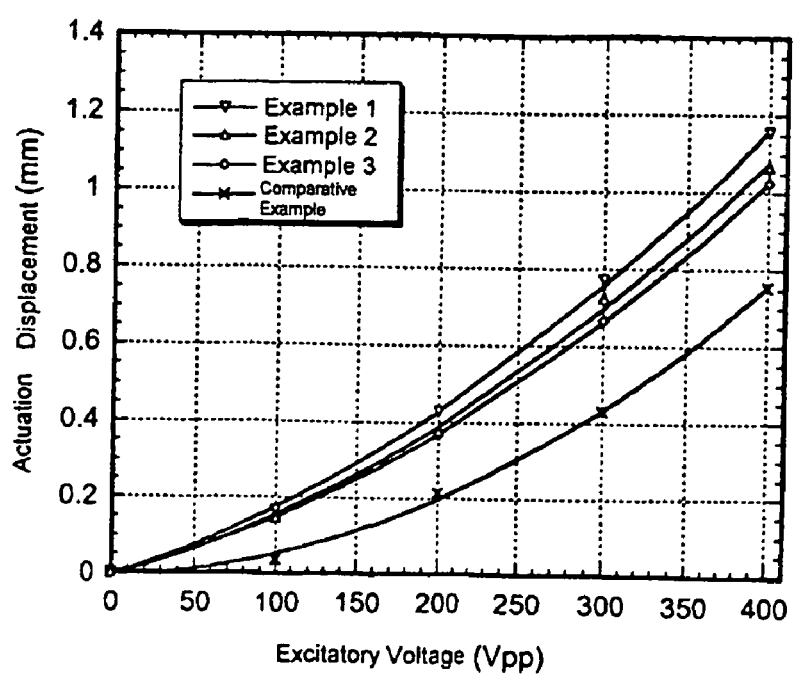
FIG. 8 graphically illustrates the vertical actuation displacement with respect to the excitatory voltage in the examples of the present invention and the comparative example.

FIG. 8 graphically illustrates the vertical actuation displacement with respect to the excitatory voltage in the examples of the present invention and the comparative example, with a voltage of 400 V being supplied to the electrodes of the piezoelectric materials in a simply supported state. It was seen that the displacement was improved by 53% or more in the curved shape actuator of the present invention compared with the thin layer unimorph driver.

From the above results, it could be confirmed that a weight reduction and a displacement improving were achieved by replacing the metallic layer portion with the lightweight fiber-reinforced polymer materials. Further, a tailoring was possible by using the fiber-reinforced polymer composite materials, that is, the laminating angle and size can be varied in accordance with the design purpose.

According to the present invention as described above, the replacement of the metallic layer portion with the lightweight fiber-reinforced polymer materials brings a lightening of the actuator by 34% or more, and an improvement of the displacement by 53% or more, while the electrical safety is superior. Further, the design flexibility is enhanced, and different sectional shapes of different curvatures can be formed along the chord line.

In the above, the present invention was described based on the specific preferred embodiments and the attached drawings, but it should be apparent to those ordinarily skilled in the art that various changes and modifications can be added without departing from the spirit and scope of the present invention, which will be defined in the appended claims.

What is claimed is:

1. A curved shape actuator device composed of composite materials, comprising:
   an electro active material layer 10 to be deformed by an electric field;
   a lightweight fiber-reinforced polymer composite material layer 20 disposed under the electro active material layer 10 and having a high thermal expansion coefficient and a low elasticity coefficient;
   a lightweight fiber-reinforced polymer composite material layer 30 disposed upon the electro active material layer 10 and having a low thermal expansion coefficient and a high elasticity coefficient; and
   an insulating layer 23 interposed between the electro active material layer 10 and the lightweight fiber-reinforced polymer composite material layer 30.

2. The curved shape actuator device as claimed in claim 1, further comprising: insulating layers 24 and 22 formed on an outside face of the upper composite material layer 30 and on both ends of the electro active material layer 10 respectively.

3. The curved shape actuator device as claimed in claim 1, wherein the electro active material layer 10 is made of a piezoelectric ceramic, PVDF (Polyvinylidene fluoride), or a ferroelectric or electro-strictive material.

4. The curved shape actuator device as claimed in claim 1, wherein the lower composite material layer 20 is made of a glass-fiber-reinforced plastic material or an engineering plastic material.

5. The curved shape actuator device as claimed in claim 1, wherein the upper composite material layer 30 is made of a carbon fiber-reinforced plastic material or Kevlar fiber-reinforced plastic material.

6. The curved shape actuator device as claimed in claim 1, wherein the insulating layers 22, 23 and 24 are made of a glass fiber-reinforced plastic material or an engineering plastic material.

7. The curved shape actuator device as claimed in claim 1, wherein the electro active material layer is disposed departed upward or downward from a bending neutral surface.

8. The curved shape actuator device as claimed in claim 1, wherein the actuator device has a curvature variation defined as follows:

$$\Delta\kappa = c_{ua} \cdot E_a \cdot d_{31} \cdot \Delta V$$

where $c_{ua}$ is a coefficient (defined to be a/D) of unimorph actuator (1/N m), a is a length of a moment arm (m×10$^{-4}$), D is a sum of a bending stiffness (N m$^2$× 10$^{-5}$) of respective laminas, $E_a$ is an elasticity coefficient (GPa), $d_{31}$ is a piezoelectric material constant, and $\Delta V$ is an excitatory voltage (V) supplied to the electro active material layer.

9. The curved shape actuator device as claimed in claim 1, wherein the lightweight fiber-reinforced polymer composite material layers 20 and 30 and the insulating layers 22, 23 and 24 are made of adhesively superior high performance fiber-reinforced polymer prepreg composite materials.

10. The curved shape actuator device as claimed in claim 2, wherein the insulating layers 22, 23 and 24 are made of a glass fiber-reinforced plastic material or an engineering plastic material.

11. The curved shape actuator device as claimed in claim 2, wherein the lightweight fiber-reinforced polymer composite material layers 20 and 30 and the insulating layers 22, 23 and 24 are made of adhesively superior high performance fiber-reinforced polymer prepreg composite materials.

* * * * *